(12) United States Patent
Wen et al.

(10) Patent No.: US 6,407,574 B1
(45) Date of Patent: Jun. 18, 2002

(54) METHOD AND SYSTEM FOR UTILIZING HOSTILE-SWITCHING NEIGHBORS TO IMPROVE INTERCONNECT SPEED FOR HIGH PERFORMANCE PROCESSORS

(75) Inventors: Huajun Wen; Hung Cai Ngo, both of Austin, TX (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 09/670,436

(22) Filed: Sep. 26, 2000

(51) Int. Cl.[7] ............................................... H03K 17/16
(52) U.S. Cl. ............................ 326/21; 326/30; 326/86; 326/90; 326/17; 327/170
(58) Field of Search ............................... 326/17, 21, 30, 326/86, 90; 327/170; 333/22 R; 375/220

(56) References Cited

U.S. PATENT DOCUMENTS

| | | | | |
|---|---|---|---|---|
| 5,900,766 A | * | 5/1999 | Naffziger | 327/382 |
| 6,078,623 A | * | 6/2000 | Isobe et al. | 375/259 |
| 6,094,070 A | * | 7/2000 | Nakamura | 326/86 |
| 6,184,717 B1 | * | 2/2001 | Crick | 326/86 |
| 6,204,712 B1 | * | 3/2001 | Camerlo | 327/292 |

* cited by examiner

Primary Examiner—Michael Tokar
Assistant Examiner—Vibol Tan
(74) Attorney, Agent, or Firm—Casimer K. Salys; Bracewell & Patterson, L.L.P.

(57) ABSTRACT

Disclosed is a system for reducing propagation delays caused by capacitive coupling of RC interconnects. The system comprises a first interconnect utilized for propagating signals, a second interconnect also utilized for propagating signals but which propagates signals at a faster rate than the first interconnect, and a charge dumping circuit with an input coupled to a point on the second interconnect and an output coupled to a corresponding point on the first interconnect. The charge dumping circuit includes a pulse generation circuit and a select-signal generation circuit, both of which are utilized to enable charge to be dumped from the second interconnect to the first interconnect to increase switching times of the signals propagating on the first interconnect and improve overall propagation speed.

16 Claims, 5 Drawing Sheets

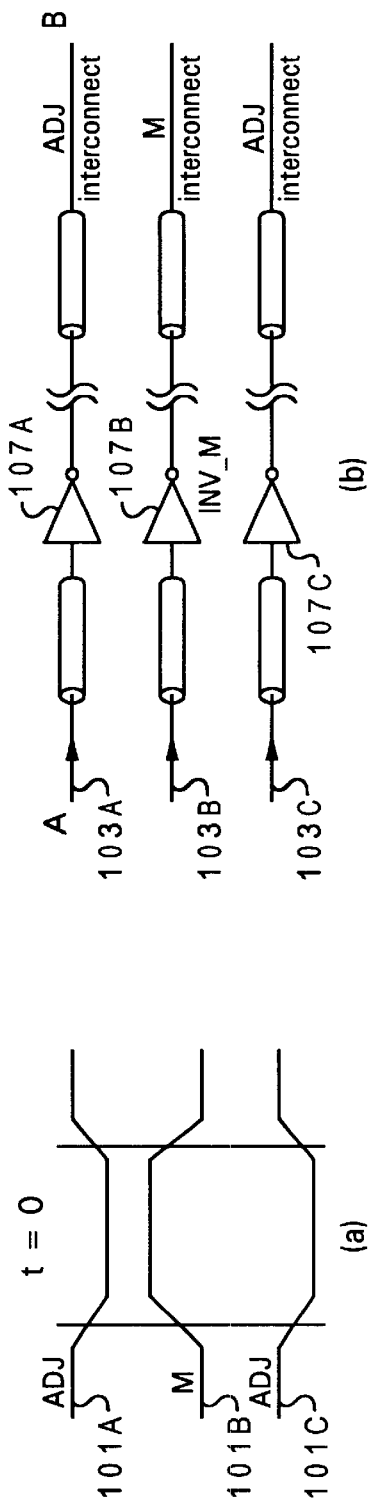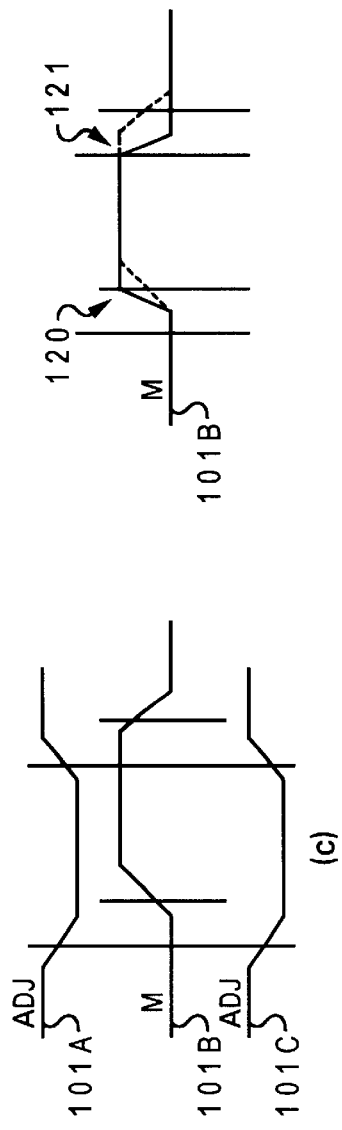

METHOD AND SYSTEM FOR UTILIZING HOSTILE-SWITCHING NEIGHBORS TO IMPROVE INTERCONNECT SPEED FOR HIGH PERFORMANCE PROCESSORS

BACKGROUND OF THE INVENTION

1. Technical Field

The present invention relates in general to interconnects (or busses) and, in particular to signal propagation on interconnects. Still more particularly, the present invention relates to a method and system for improving the overall propagation speed of signals on interconnects.

2. Description of the Related Art

Increasing the propagation speed of signals traveling on interconnects (or busses) of a chip while concurrently reducing the size of the chip presents a significant challenge in chip development. Chips utilized as microprocessors require a high wire packing density for transmitting data due to their large on-chip memory structures. Technological improvements, such as continued complementary metal oxide semiconductors (CMOS) scaling, also reduce dimensions and spacings of the interconnect wires on the chip. Smaller spacing, however, increases coupling capacitance and results in longer delays in interconnects.

The performance of current and future microprocessors and other integrated circuits (ICs) are limited by delays in signal propagation along on-chip interconnections. On long, wide busses that are designed to switch simultaneously, the capacitive coupling (noise) induced delay can be as high as 50% of total propagation delay for wires formed with high level metals of the IC. This percentage, which may become even higher with further scaling, represents a significant performance limitation for high performance processors.

In current chip designs, the interconnect RC delay is minimized by optimizing buffer placement and buffer sizing and utilizing wires routed on non-minimum pitches. The capacitive coupling is reduced by increasing wire spacing or employing shielding wires between signal wires. Additional methods of reducing the capacitive coupling are sometimes utilized. One of these methods involves switching wire positions to reduce the length of coupling wire pairs and subsequently reduce the coupling effects of a neighboring wire. Another method involves introducing different phases for signals on neighboring wires. Drawbacks of these approaches include reduced numbers of available signal wires and an eventual increase in wire congestion at the chip integration level. In addition, optimal buffer placement often can not be implemented due to constraints of the overall chip floor-plan. Moreover, because of the difficulties and inaccuracy in modeling of coupling noise, unexpected timing failures can occur and may only be detected at a relatively late design phase. Addressing these failures usually requires redesigning the whole chip interconnect topology, which forces new changes on chip integration and often negatively impacts the product delivery schedule.

The present invention recognizes that it would be desirable to have a method and system for improving interconnect speed for high performance ICs such as processor chips. A method and system which speeds up lagging signal propagation without redesigning the interconnect and chip integration would be a welcomed improvement. These and other benefits are provided by the described inventions

SUMMARY OF THE INVENTION

Disclosed is a system for reducing propagation delays caused by coupling capacitance of RC interconnects. The system comprises a first interconnect utilized for propagating signals, a second interconnect also utilized for propagating signals but which propagates signals at a faster rate than the first interconnect, and a charge dumping circuit with an input coupled to a point on the second interconnect and an output coupled to a corresponding point on the first interconnect. The charge dumping circuit comprises a plurality of transistors and dumps charge from the second interconnect to the first interconnect to increase switching times of the signals propagating on the first interconnect and improve overall propagation speed.

In the preferred embodiment, the system comprises two interconnects adjacent to the first interconnect that are both connected to inputs of separate charge dumping circuits. Both adjacent interconnects dump a charge to the first interconnect to increase propagation speed of signals on the first interconnect. The charge dumping circuit comprises a select-signal generation circuit and two pulse generation circuits. The dump time and magnitude of the charge is controlled by these circuits, respectively. The outputs of the pulse generation circuits opens a p-type and n-type transistor to dump charge to the first interconnect.

All objects, features, and advantages of the present invention will become apparent in the following detailed written description.

BRIEF DESCRIPTION OF THE DRAWINGS

The novel features believed characteristic of the invention are set forth in the appended claims. The invention itself however, as well as a preferred mode of use, further objects and advantages thereof, will best be understood by reference to the following detailed description of an illustrative embodiment when read in conjunction with the accompanying drawings, wherein:

FIGS. 1A and 1C depict a series of timing diagrams for three signals propagating through adjacent interconnects with one signal propagating at a slower speed than the adjacent signals in accordance with one embodiment of the present invention;

FIG. 1B illustrates three adjacent interconnects on which the three adjacent signals of FIGS. 1A and 1C propagate;

FIG. 1D illustrates a timing diagram for the three signals after charge has been dumped to the slower propagating interconnect in accordance with one embodiment of the present invention;

DETAILED DESCRIPTION OF THE PREFERRED EMBODIMENT

Figure 2:
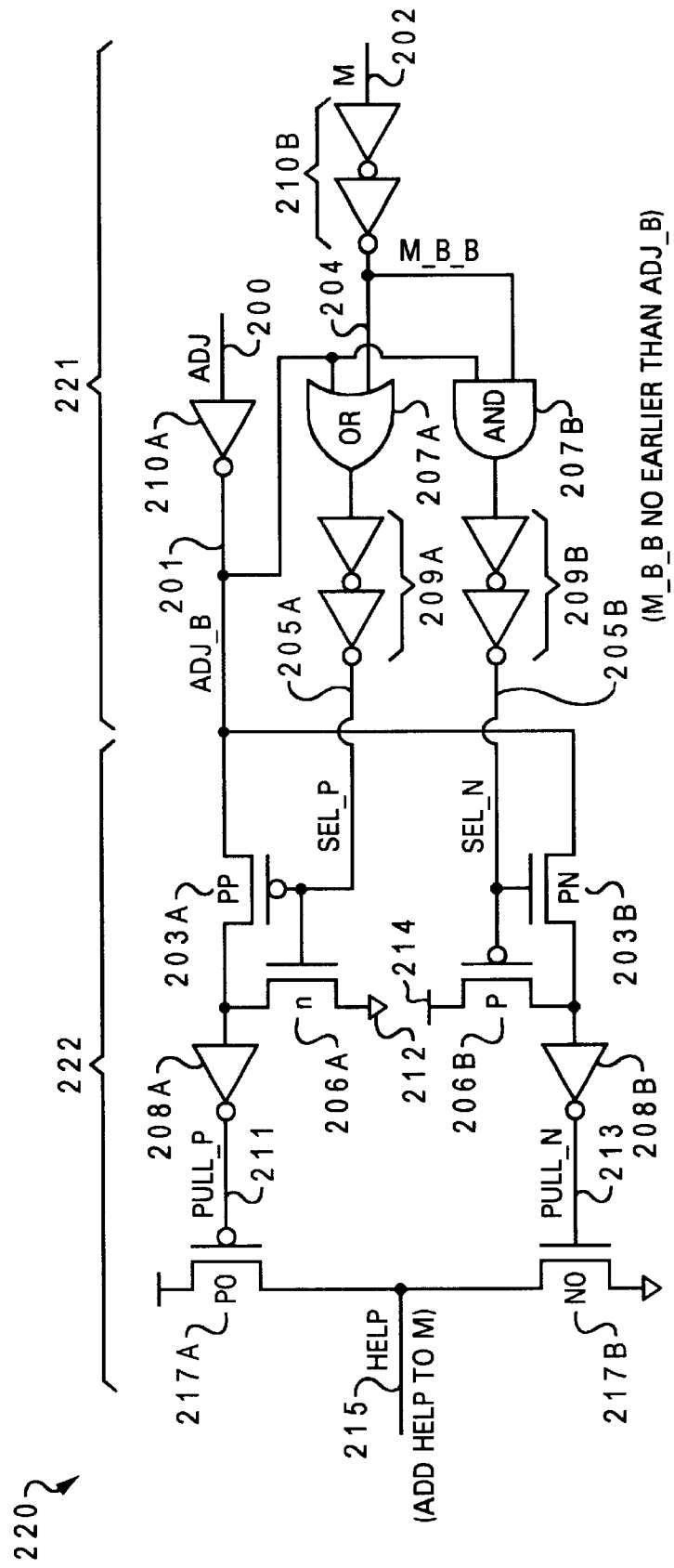
FIG. 2 depicts a charge dumping circuit by which a preferred embodiment of the present invention may be implemented.

The present invention provides a new method and system to reduce the coupling induced delay of signals propagating on long busses by improving slew rate of the signals. The invention is implemented utilizing a circuit described herein, which is preferably attached to the end of a problematic path (i.e., a path with a delay or other undesirable propagation characteristics) to solve timing failures. Utilization of the circuit of the invention does not require the redesign of the bus or bus topology, resulting in a significant advantage for chip integration. The utilization of the circuit operates to dump (or transfer) charge from interconnects with faster propagating signals to a neighboring interconnect with a slower signal so that the switching speed of the latter signal is improved and the propagation delay is reduced. The invention may be implemented with a set of interconnects and associated signals as illustrated in FIGS. 1A–1C. As described herein, the invention refers to adjacent interconnects (and signals); however, the invention is also applicable to interconnects that are near to, but not necessarily adjacent to, each other.

With reference now to the figures and in particular with reference to FIG. 1A, there are illustrated the waveforms of three signals 101A–101C that are latched at the same time, t=0, and that propagate through three long, adjacent (and coupled) interconnect (busses or wires) 103A–103C (illustrated in FIG. 1B) from point A to point B. Each one of interconnects 103A–103C has a plurality of drivers that increase the strength of the signal as it propagates through interconnects 103A–103C. Representative drivers 107A–107C are illustrated. Due to the capacitive coupling effects of interconnects 103A–103C, propagation speeds and thus delays of the three signals 101A–101C vary with their switching patterns.

FIG. 1C illustrates the new waveforms of three signals 101A–101C after they have propagated through capacitively coupled interconnects 103A–103C, respectively. In particular, when two adjacent signal (ADJ) interconnects 103A and 103C are designed to be adjacent to quiet neighbors (i.e., power wires or random signal wires with no switching-window overlay with ADJs), signals on ADJ interconnects 103A and 103C propagate faster than on M interconnect 103B, as shown in FIG. 1C. The worst propagation delay for the middle signal 101B (referred to hereafter as M) occurs when the two adjacent signals 101A and 101C (both referred to hereafter as ADJ) are switching simultaneously in the opposite direction with respect to M 101B, as shown in FIG. 1A. When the above scenario occurs ADJs 101A and 101C are referred to as hostile switching neighbors relative to M 101B. The invention reduces the worst case delay of M 101B. Thus, the invention takes advantage of the signals in the neighboring interconnects switching opposite to the signals in the middle interconnect. No significant benefit is provided when the signals are switching in the same direction.

A charge dumping circuit designed in accordance with a preferred embodiment of the present invention and which is utilized to dump charge from at least one ADJ interconnect 103A or 103C to M interconnect 103B is illustrated in FIG. 2. For simplicity, further references to ADJ interconnects will be assumed to refer to AJD interconnect 103A. Circuit elements are indicated with numerals and referenced signals are indicated with bolded acronyms (e.g., ADJ, SEL, etc.). Charge dumping circuit 220 comprises an input circuit 221 and an output circuit 222.

Input circuit 221 is created with a series of drivers (illustrated and described herein as inverters and buffers, i.e., pairs of inverters) and other logic components. A first input 200 of input circuit 221 is 15 coupled to ADJ interconnect 103A. First input 200 includes a first inverter 210A. Output connector 201 of first inverter 210A is divided with a first branch connected to the sources of p-type transistor PP 203A and n-type transistor PN 203B of output circuit 222, and a second branch connected to inputs of OR gate 207A and AND gate 207B. A second input 202 of input circuit 221 is coupled to M interconnect 103B. Second input 202 includes first buffer 210B, whose output connector 204 is also divided and coupled both to the next input of OR gate 207A and the next input of AND gate 207B. The output connectors of OR gate 207A and AND gate 207B are coupled to second and third buffers 209A and 209B, respectively. Output connectors 205A and 205B of second and third inverter pairs 209A, 209B are both divided. The two branches of output connector 205A of second buffer 209A are coupled to the gates of p-type transistor PP 203A and n-type transistor n 206A, respectively. The two branches of output connector 205B of third buffer 209B are coupled to the gates of n-type transistor PN 203B and p-type transistor p 206B, respectively.

Transistors PP 203A, PN 203B, p 206B, and n 206A are included in output circuit 222. The drains of transistor PP 203A and PN 203B are connected to inverters 208A, 208B, respectively, and the corresponding output connectors of inverters 208A, 208B are coupled to the gates of p-type transistor P0 217A and n-type transistor NO 217B. The drain of transistor PO 217A is coupled to the source of transistor NO 217B and provides output 215, which is connected to M interconnect 103B.

In operation, input circuit 221 receives ADJ signal 101A (or 101B) at first input 200 and M signal 101B at second input 202. Inverted (hostile) ADJ_B signal is passed through PP transistor 203A and PN transistor 203B whose gates are controlled by SEL_P and SEL_N, respectively. SEL_P and SEL_N are the outputs of OR gate 207A and AND gate 207B, respectively and are created with buffered versions of M signal 101A and ADJ signal 101A (i.e., M_B_B and ADJ_B). SEL_P and SEL_N are added on the pass gates of pass gate of PP 203A, n 206A, and PN 203B, p 206B. Because the primary function of input circuit 221 is to generate select signals SEL_P and SEL_N to control the open time of p-type transistor, PP 203A, and n-type transistor PN 203B input circuit 221 is also referred to as select-signal generation circuit.

M_B_B, which is created by passing M signal 101B through buffer 210B, has the same phase as M signal 101B and is intentionally delayed to control the open time of the transistors. SEL_P and SEL_N signals determine how long transistors PP 203A, and PN 203B are turned on. The time is preferably long enough to provide sufficient charge dumping to M interconnect 103B.

When PP 203A is on, n 206A is off. When PN 203B is on, p 206B is off. The combinations of mutually exclusive transistors PP 203A and n 206A, and transistors PN 203B and p 206B operate to create a 0 and 1 pulse, respectively, and are referred to as pulse generation circuits. Use of the inverters 210A, 208A, and 208B increases the strength of the signals as they propagate along the interconnects and results in a more effective charge dump.

GND pulse at node PULL_P 211 and VDD pulse at node PULL_N 213 are generated, and both control transistors PO 207A and NO 207B, respectively, to generate output signal, HELP. HELP is added to M signal 101B of M interconnect 103B. In the preferred embodiment, HELP is only activated in the transition regions of M 101B propagating on M interconnect 103B. HELP accelerates the rising and falling edges of M 101B. FIG. 1D illustrates the improvement in the switching edges 120 and 121 of M 101B. The charge strength and timing of HELP relative to M 101B determine the improvement of the switching delays of M 101B.

The pulse widths of PULL__P and PULL__N are controlled by the length of delay through the buffers. Note, if the delay of two (2) inverters is not sufficiently long, four inverters or a higher even-number of inverters may be utilized as buffers. When the condition "M__B__B no earlier than ADJ__B" is met, HELP is activated. Thus HELP is only activated when ADJs 101A and 101C propagate faster than M 101B (as illustrated in FIG. 1C). HELP is idle for all other switching conditions to ensure that charge is only dumped from faster signals to slower signals.

In the preferred embodiment, inverted signals ADJ__B are created with minimum delay. Also, the feedback from ADJ__B to HELP occurs quickly. The sizes of transistor P0 217A and transistor N0 217B may be, but are not necessarily, selected to cancel the coupling noise injected by hostile neighbors (i,e., neighboring interconnects on which signals propagate at a faster speed and are inverted relative to the reference signal). At P0 and N0 transistor sizes less than ⅓ the size of driver INV__M 107B, significant delay reduction is achieved.

Figure 3:
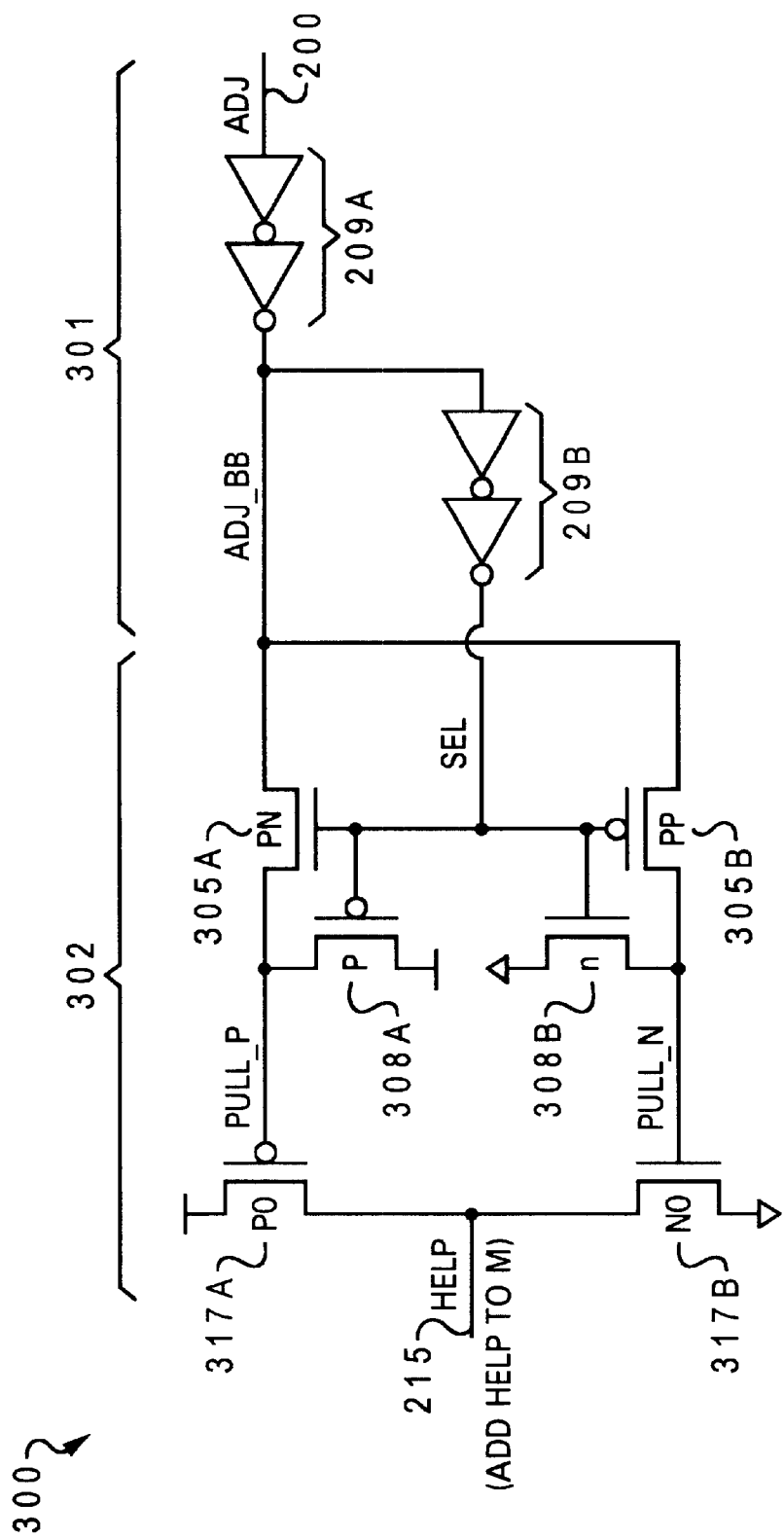
FIG. 3 depicts another embodiment of a charge dumping circuit in accordance with another embodiment of the invention.

A simpler embodiment of a circuit utilized to dump charge from ADJ 101A to M 101B is shown in FIG. 3. Second charge dumping circuit 300 has an input circuit 301 comprising of two buffers 209A and 209B. ADJ__BB (rather than ADJ__B) is passed through the pass-transistors PN 305A and PP 305B whose gates are now controlled by select signal, SEL. ADJ__BB is a buffered result of ADJ to increase the signal strength. SEL is generated by delaying ADJ__BB through an additional buffer 209B in order to produce a 0 pulse for PULL__P and a 1 pulse for PULL__N. The length of the delay attributable to buffers 209B determines the width of the 0 and 1 pulses. PULL__P and PULL__N turn on transistors P0 317A and N0 317B, respectively, to produce signal HELP at output 215, which is coupled to M interconnect 103B. Thus, second charge dumping circuit 300 also dumps charge to M interconnect 103B.

Note that inverters 210A, 208A, and 208B may be utilized instead of buffer 209A in order to get more effective charge dumping. If these inverters 210A, 208A, and 208B are utilized, the position of the pulse generation circuits (PN/p and PP/n) should be switched as implemented in FIG. 2. For second charge dumping circuit 300, the worst case delay on M interconnect 103B is reduced. One possible drawback of second charge dumping circuit 300 is that charge is dumped from ADJ interconnect 103A to M interconnect 103B regardless of the relative speed and switching direction of the two signals. For input switching conditions other than illustrated in FIG. 1C, charge is also dumped from ADJ to M. Thus the delays may get worse. However, the worst case delay on M interconnect 103B is the limiting factor for the overall performance, and the effects on other input conditions can be tolerated. Charge dumping circuit 220 of FIG. 2 is the preferred implementation because charge dumping circuit 220 does not have the above drawback.

Figure 4:
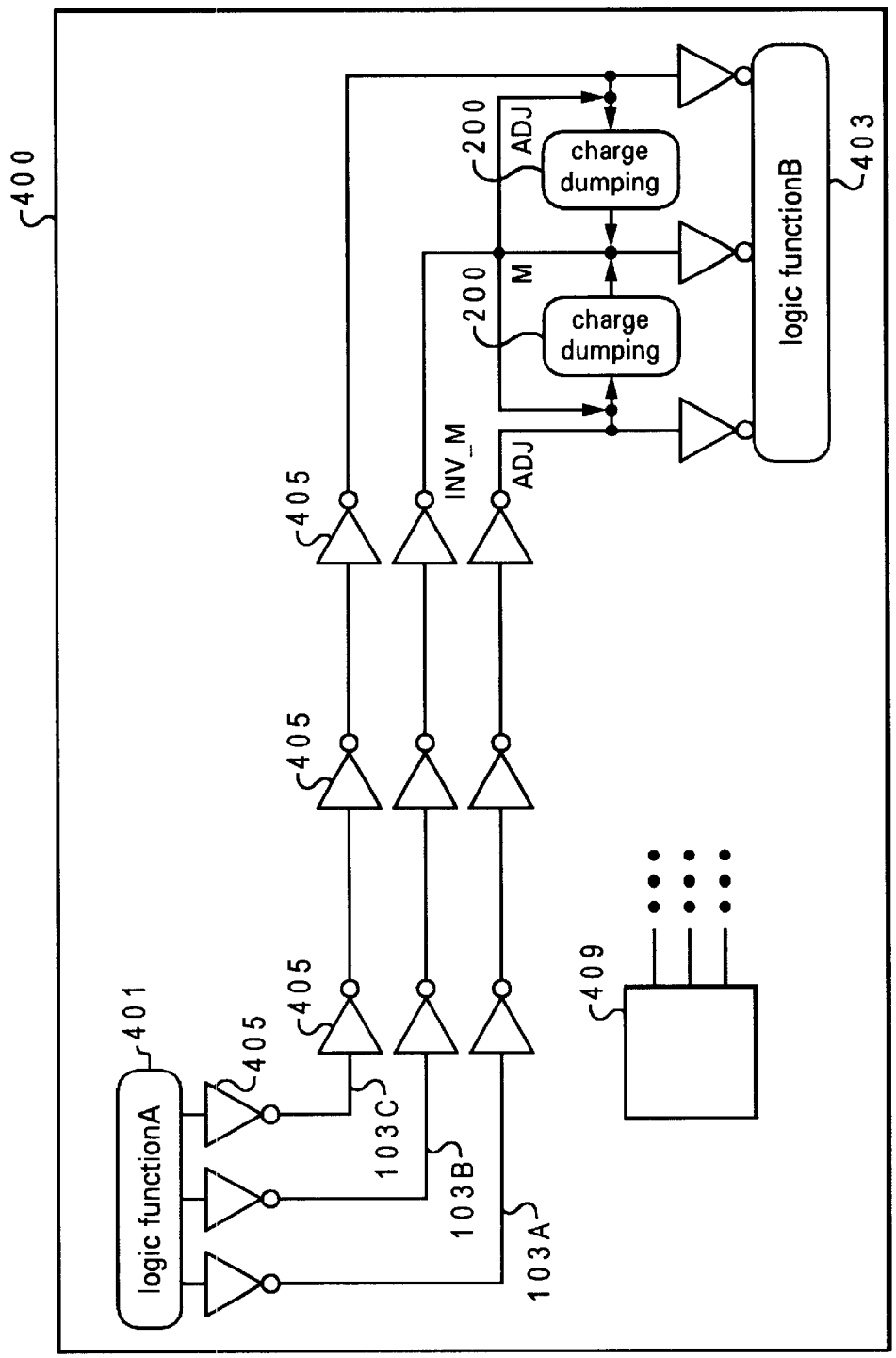
FIG. 4 illustrates an integrated circuit (IC) chip with charge dumping circuits coupled to the interconnects in accordance with a preferred implementation of the invention.

FIG. 4 illustrates the charge dumping circuit of either FIG. 2 (or FIG. 3) coupled to interconnects on an integrated circuit (IC) chip. In FIG. 4, an assumption has been made that interconnects 103A–103C are designed such that signals propagate faster on ADJ interconnects 103A and 103C than on M interconnect 103B. IC chip 400 may be a processor chip or memory chip and has interconnects 103A–103C running from logic function A 401 to logic function B 403 on IC chip 400. Interconnects 103A–103C include a number of drivers 405 that periodically boost the strength of the signals propagating along interconnects 103A–103C. Although drivers 405 are illustrated herein as invertors placed in-line with interconnects 103A–103C, others types of drivers 405 (e.g. buffers) may be utilized to boost signal strength.

Two charge dumping circuits 220 are illustrated coupled between ADJ interconnects 103A and 103C and M interconnect 103B. As illustrated, charge dumping circuits 220 are preferably attached near the end of the propagation lines; however, the invention contemplates other placements of charge dumping circuit along interconnects 103A–103C. IC chip 400 also includes additional functional logic 409, illustrated as a box with connectors. Logic function A 401, logic function B 403, and additional functional logic 409 may include or together create memory devices, processor logic, or other components interconnected on IC chip 400.

Simulation results show that for interconnects that are around 15 mm long and that are formed on high level metal in 0.18 um technology, charge dumping circuit 220 reduces the worst case delay by 10%. The delay on adjacent wires remained almost unchanged because of the relatively small load that is added to ADJs. HELP 215 successfully turned off for switching conditions other than that described above. Additional improvement is expected for longer busses and for busses with skewed rising and falling delays. In the latter case, only the PULL__P 211 or PULL__N 213 tree may be needed to speed up the slower switching edge. Note that the charge dumping circuits may inject some noise on M interconnect 103B when M 101B is not switching. Although the presence of noise is preferably analyzed for specific circuit families, the present invention recognizes that attaching two-stage invertors to M interconnect 103A is usually an effective way to suppress noise.

Figure 5:
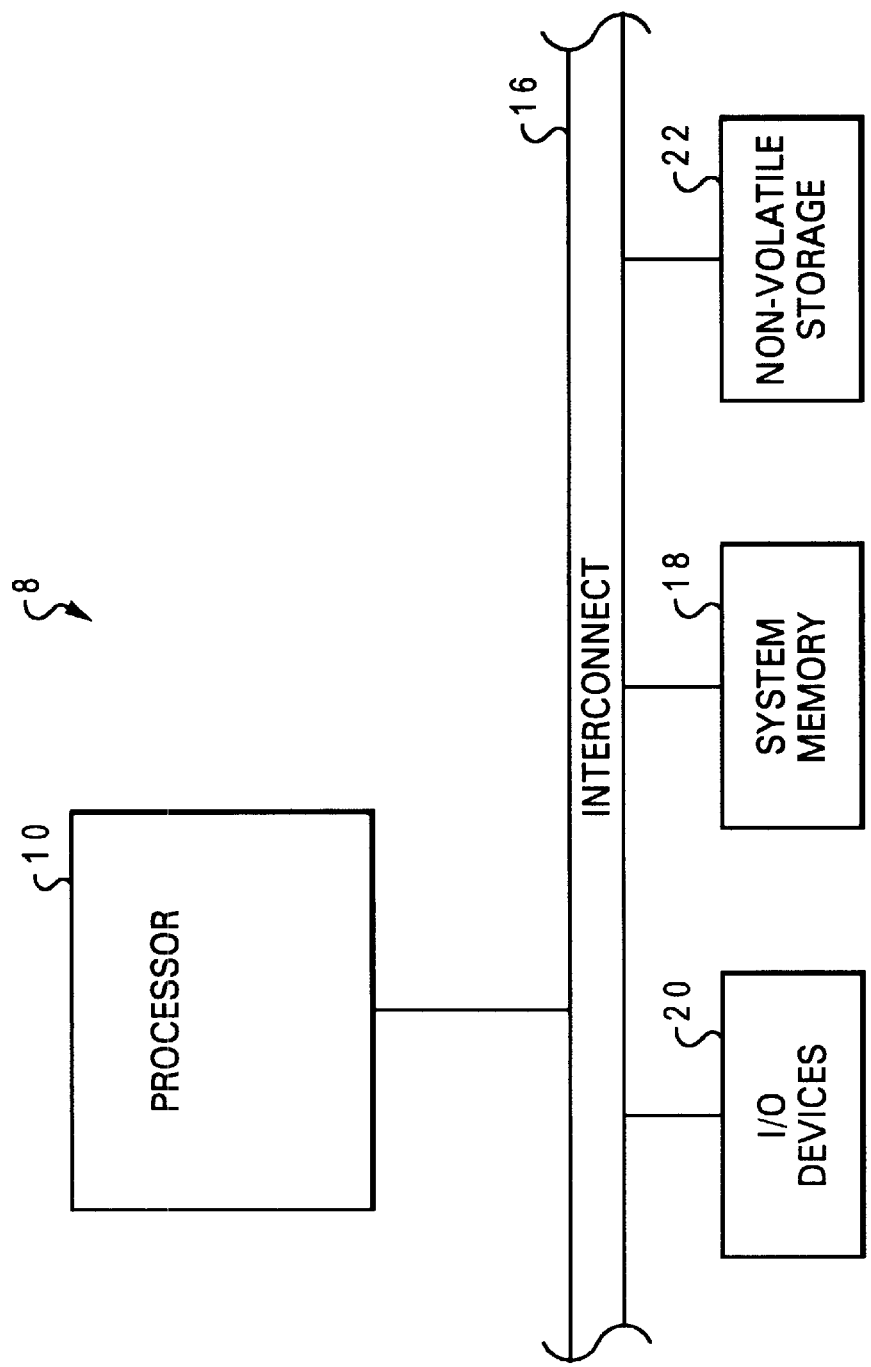
FIG. 5 illustrates a computer system, which utilizes a processor chip designed as shown in FIG. 4 in accordance with a preferred implementation of the invention.

FIG. 5 illustrates a computer system 8 with a plurality of components which may have incorporated the features of the present invention in their circuit design. In the illustrated embodiment IC chip 400 of FIG. 4 is being advantageously utilized as a processor chip 10 within computer system 8. Computer system 8 further includes input/output (I/O) devices 20, system memory 18, and non-volatile storage 22, which are each coupled to interconnect 16. Those skilled in the art will appreciate that the features of the present invention, which increased the signal propagation speed on an interconnect may be advantageously utilized within any of the illustrated components of computer system 8.

As has been described, propagation of a signal can be accelerated by dumping charge from faster propagating signals. In embodiments where more wires are capacitively coupled and the relative signal propagation speeds are not known, the above charge dumping circuit 220 is applied to every wire. As discussed above, charge will only be dumped from faster (hostile) signals to slower ones. Consequently, only the slower signals are sped up while the propagating speeds of faster signals remain relatively unchanged.

While the invention has been particularly shown and described with reference to a preferred embodiment, it will be understood by those skilled in the art that various changes in form and detail may be made therein without departing from the spirit and scope of the invention.

What is claimed is:

1. An integrated circuit comprising:
   at least one transmitting logic and at least one receiving logic;
   a first interconnect coupling said at least one transmitting logic with said at least one receiving logic, said first interconnect propagating a first signal at a first speed;
   a second interconnect propagating a second signal at a second speed faster than said first speed;
   a charge dumping circuit connected between said first interconnect and said second interconnect to transfer charge from said second interconnect to said first interconnect responsive to the relative states of said first and second signals, wherein said charge dumping circuit comprises a first signal helping circuit, which is selectively enabled responsive to the relative states of said first and second signals.

2. The integrated circuit of claim 1, wherein said second interconnect is a near neighbor of said first interconnect.

3. The integrated circuit of claim 1, further comprising a third interconnect and a second charge dumping circuit, wherein:

said third interconnect propagates a third signal faster than said first speed; and said second charge dumping circuit is connected between said first interconnect and said third interconnect to transfer charge from said third interconnect to said first interconnect responsive to the relative states of said first signal and said third signal.

4. The integrated circuit of claim 1, wherein said selectively enabled first signal helping circuit is a pulse generation circuit and wherein further said integrated circuit comprises a select-signal generation circuit that switches said pulse generation circuit on and off.

5. The integrated circuit of claim 4, wherein said pulse generation circuit comprises a mutually exclusive p-type and n-type transistor pair coupled together.

6. The integrated circuit of claim 1, wherein said integrated circuit is located on a chip.

7. The integrated circuit of claim 6, further comprising processor logic.

8. The integrated circuit of claim 6, further comprising memory logic.

9. A system for reducing propagation delays of a signal traveling on an interconnect, said system comprising:

a first interconnect that propagates a first signal;

a second interconnect that propagates a second signal at a faster rate than said first interconnect propagates said first signal; and a charge dumping circuit connected between said first interconnect and said second interconnect to transfer charge from said second interconnect to said first interconnect responsive to the relative states of said first and second signals, wherein said charge dumping circuit comprises a first signal helping circuit, which is selectively enabled responsive to the relative states of said first and second signals.

10. The system of claim 9, wherein said second interconnect is a near neighbor of said first interconnect.

11. The system of claim 9, further comprising a third interconnect and a second charge dumping circuit, wherein:

said third interconnect propagates a third signal faster than said first speed; and said second charge dumping circuit is connected between said first interconnect and said third interconnect to transfer charge from said third interconnect to said first interconnect responsive to the relative states of said first and third signals.

12. The system of claim 9, wherein said selectively enabled first signal helping circuit is a pulse generation circuit and wherein further said integrated circuit comprises a select-signal generation circuit that switches said pulse generation circuit on and off.

13. A method for improving interconnect speed in a circuit, said method comprising the steps of:

coupling an output of a charge dumping circuit to a first interconnect for which improved propagation speed of a first signal may be desired, wherein said charge dumping circuit comprises a pulse generation circuit and a select-signal generation circuit;

coupling an input of said charge dumping circuit to a second interconnect running near to said first interconnect; and selectively transferring charge from said second interconnect to said first interconnect utilizing the charge dumping circuit such that propagation time of said first signal is improved.

14. The method of claim 13, wherein said step of transferring charge includes:

generating a pulse via a plurality of transistors within said charge dumping circuit utilizing said first signal and said second signal, wherein said pulse is generated only when said first signal propagates slower than said second signal; and passing said pulse through said output of said charge dumping circuit at a time corresponding to a switching time of said first signal.

15. The method of claim 13, wherein said charge dumping circuit comprises a plurality of transistors, said method further comprising:

in response to second signal, opening a gate of a first transistors for a time interval corresponding to the difference between the arrival time of said first signal at a source of said first transistor and the arrival time of said second signal to generate said pulse.

16. A data processing system comprising:

a processor;

a memory coupled to said processor via an interconnect; and wherein at least one of said processor and said memory comprises:

at least one transmitting logic and at least one receiving logic;

a first interconnect coupling said at least one transmitting logic with said at least one receiving logic, said first interconnect propagating signals at a first speed;

a second interconnect propagating a second signal at a second speed faster than said first speed;

a charge dumping circuit including a pulse generation circuit and a select-signal generation circuit, wherein said charge dumping circuit is connected between said first interconnect and said second interconnect to transfer charge from said second interconnect to said first interconnect responsive to the relative states of said first and second signals.

* * * * *